United States Patent [19]
Sato

[11] Patent Number: 5,622,304
[45] Date of Patent: Apr. 22, 1997

[54] TAPE BONDING APPARATUS

[75] Inventor: Koji Sato, Akishimi, Japan

[73] Assignee: Kabushiki Kaisha Shinkawa, Tokyo, Japan

[21] Appl. No.: 590,560

[22] Filed: Mar. 21, 1996

[30] Foreign Application Priority Data

Mar. 22, 1995 [JP] Japan .................................. 7-087676

[51] Int. Cl.⁶ .................................................. H01L 21/603
[52] U.S. Cl. ............................ 228/44.7; 228/46; 228/222
[58] Field of Search ............................... 228/180.22, 212, 228/218, 222, 6.2, 44.7, 46; 437/206

[56] References Cited

U.S. PATENT DOCUMENTS 4,359,623 11/1982 Fanning ................................ 228/6.1
4,976,393 12/1990 Nakajima et al. .................... 228/220

FOREIGN PATENT DOCUMENTS 2-3543    1/1990  Japan ............................. H01L 21/60
2-273950 11/1990  Japan ............................. H01L 21/60
4-58183   9/1992  Japan ............................. H01L 21/60

Primary Examiner—Samuel M. Heinrich
Attorney, Agent, or Firm—Koda and Androlia

[57] ABSTRACT

A cooling system for cooling the upper and lower clampers of a wire bonding apparatus which hold a tab tape in between including a fluid passage formed inside the upper clamper so that air or water which is supplied and flowing inside the fluid passage cools the upper clamper. The system further includes air pipes underneath the lower clamper so that air is blown out of the air pipes onto the lower clamper.

8 Claims, 5 Drawing Sheets 5,622,304

TAPE BONDING APPARATUS

BACKGROUND OF THE INVENTION

1. Field of the Invention

The present invention relates to a tape bonding apparatus and more particularly to a cooling system for cooling upper and lower clampers used in the tape bonding apparatus.

2. Prior Art

Tape bonding apparatuses for bonding a plurality of leads installed at fixed intervals on a tab tape to bumps of semiconductor pellets or single bump units are disclosed in, for example, Japanese Patent Application Publication (Kokoku) Nos. 2-3543 and 4-58183 and Japanese Patent Application Laid-Open (Kokai) No. 2-273950. FIG. 5 shows an essential portion of the typical tab tape bonding apparatuses.

In this bonding apparatus, a tab tape 2 on which a plurality of leads 1 are installed as shown in FIG. 6 is fed along an upper clamper 3 which is installed in the bonding position. When the leads 1 on the tab tape 2 are positioned in the bonding position, a lower clamper 4 is raised so as to press the tab tape 2 against the upper clamper 3. In this state, the positions of the leads 1 on the tab tape 2 are detected by a camera (not shown). Meanwhile, a semiconductor pellet 6 which has bumps 5 is carried on a pellet stage 7, and the positions of the bumps 5 of the semiconductor pellet 6 are detected at the same time as the positions of the leads 1 by the camera (not shown) that detects the positions of the leads 1 or are detected beforehand by a separately installed camera.

If there is a positional discrepancy between the leads 1 and bumps 5, the tab tape 2 and semiconductor pellet 6 are moved relative to each other so that the leads 1 and bumps 5 are aligned. Then, the leads 1 on the tab tape 2 are pushed downward, pressed against the bumps 5 and then bonded by a bonding tool 8.

In the tape bonding apparatus as described above, the pellet stage 7 and the bonding tool 8 are heated by heaters in order to improve the bonding conditions between the leads 1 and bumps 5 (although this is not disclosed in the patents listed above).

As described above, the leads 1 and bumps 5 are bonded after the positions of these have been confirmed by a camera. However, since the pellet stage 7 and the bonding tool 8 are heated, the upper clamper 3 and lower clamper 4 are also heated by radiant heat from the pellet stage 7 and the bonding tool 8; and when the upper clamper 3 and lower clamper 4 reach a certain temperature, heat is transmitted to the leads 1, and the leads 1 undergo thermal expansion. However, since the bonding between the leads 1 and bumps 5 is performed after the positions of these have been confirmed by the camera and after any positional discrepancies have been corrected in accordance with the detection results, the alignment of the leads 1 and bumps 5 at the time of bonding tends to become different from the alignment at the time of positional confirmation by the camera; thus hindering a high-precision bonding. In particular, since there has recently been a trend toward narrower lead widths and thinner lead thicknesses as a result of increasingly fine lead pitches on tab tapes, the thermal deformation of the leads has become a major problem.

SUMMARY OF THE INVENTION

Accordingly, the object of the present invention is to provide a tape bonding apparatus used in, for example, semiconductor device manufacturing, which makes it possible to minimize the thermal expansion of leads, thus assuring high-precision bonding.

The object of the present invention is accomplished by a unique structure for a tape bonding apparatus which comprises a tape clamping mechanism for clamping a tab tape between an upper clamper and lower clamper, a pellet stage which is installed beneath the tape clamping mechanism so as to carry thereon semiconductor pellets, etc., that are to be bonded to leads of the tab tape, and a bonding tool which is installed above the clamper mechanism in a vertically movable fashion, and the unique structure of the present invention is that the bonding apparatus further includes a cooling means which cools the upper clamper and lower clamper.

The object of the present invention is accomplished by another unique structure which is used in the structure described above (called the "basic structure"), and the unique structure of the present invention is that: the cooling means which cools the upper clamper is a fluid passage which is formed inside the upper clamper so as to surround a bonding window formed in the upper clamper and a fluid supply means which supplies a fluid (such as air or water) to the fluid passage; and the cooling means which cools the lower clamper is an air blowing means which blows air onto the lower clamper.

The object of the present invention is accomplished by still another unique structure which is employed in the basic structure described above and the unique structure is that the cooling means which cools the upper clamper is an air passage which is formed inside the upper clamper so as to surround a bonding window of the upper clamper, and an air supply means which supplies air to the air passage; and the cooling means which cools the lower clamper it is air blowing holes which are formed in the undersurface of the upper clamper and communicate with the air passage.

The object of the present invention is accomplished by a further unique structure employed in the basic structure described above, and the unique structure is that the cooling means which cools the upper clamper is an air passage which is a recessed groove formed in the undersurface of a guide cover fastened to the upper surface of the upper clamper or a recessed groove formed in the upper surface of the upper clamper, or recessed grooves formed in both the undersurface of the guide cover and the upper surface of the upper clamper, so that the recessed grooves surround the bonding window of the upper clamper, and in addition an air supply means which supplies air to the air passage; and the cooling means which cools the lower clamper is an air blowing means which blows air onto the lower clamper.

The object of the present invention is accomplished by a further unique structure employed in the basic structure described above, and the unique structure is that the cooling means which cools the upper clamper is an air passage which is a recessed groove formed in the undersurface of a guide cover fastened to the upper surface of the upper clamper or a recessed groove formed in the upper surface of the upper clamper, or recessed grooves formed in both the undersurface of the guide cover and the upper surface of the upper clamper, so that the recessed grooves surround the bonding window of the upper clamper, and in addition an air supply means which supplies air to the air passage; and the cooling means which cools the lower clamper is air blowing holes which are formed in the undersurface of the upper clamper so as to communicate with the air passage.

According to the structure of the present invention, the upper and lower clampers are cooled by the cooling means, and as a result, the thermal expansion of the leads caused by the upper and lower clampers is prevented. In addition, with the structure of the present invention that includes the air blowing holes, it is possible to cool the tab tape by air which is blown out from air blowing holes; thus, the thermal expansion of the leads is prevented even more effectively.

BRIEF DESCRIPTION OF THE DRAWINGS

FIG. 1 illustrates a first embodiment of the tape bonding apparatus of the present invention, wherein

FIG. 2 illustrates a second embodiment of the tape bonding apparatus of the present invention, wherein

FIG. 3 illustrates a third embodiment of the tape bonding apparatus of the present invention, wherein

FIG. 4 illustrates a fourth embodiment of the tap bonding apparatus of the present invention, wherein

DETAILED DESCRIPTION OF THE INVENTION

Figure 5:
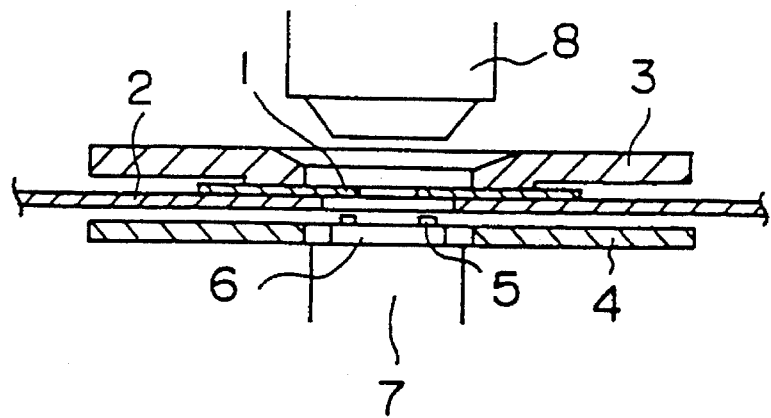
FIG. 5 is a sectional view of the essential portion of a conventional tape bonding apparatus.

The first embodiment of the present invention will be described with reference to FIG. 1. Parts which are the same as or correspond to those in FIG. 5 are labeled with the same reference numerals as in FIG. 5.

Figure 1A:
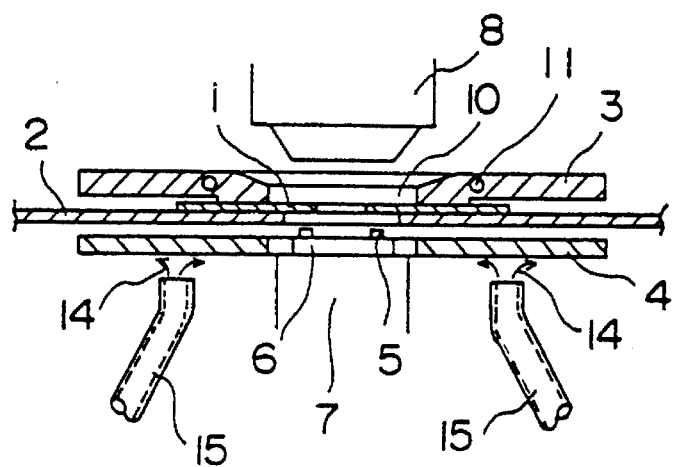
FIG. 1a is a sectional view of the essential area thereof.
Figure 1B:
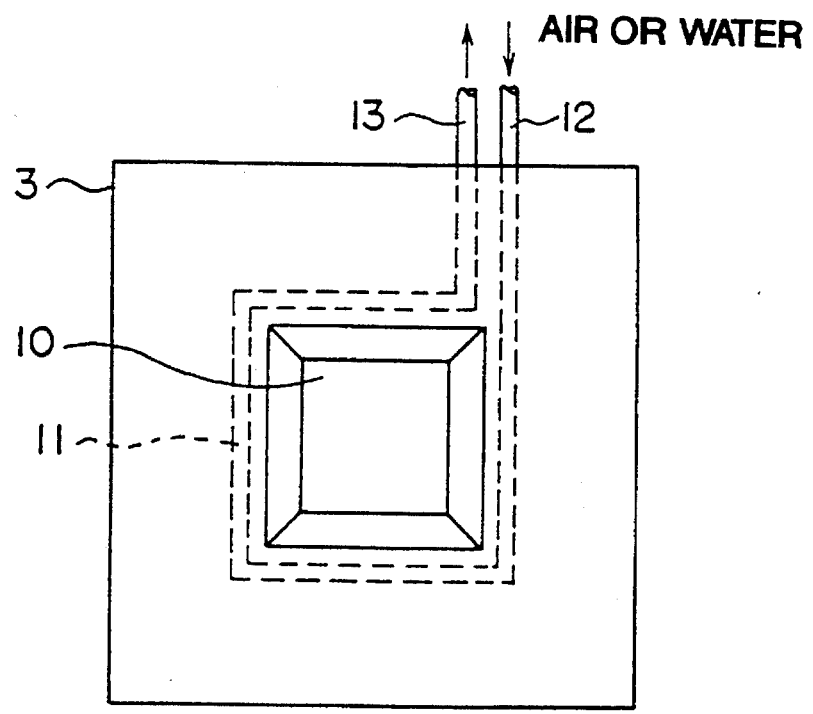
FIG. 1b is a top view of the upper clamper.

In FIG. 1, a fluid passage 11 is provided inside the upper clamper 3 so that the fluid passage 11 surrounds a bonding window 10 which is formed in the upper clamper 3. Both ends of this fluid passage 11 extend to one of four side surfaces of the upper clamper 3 as can be seen in FIG. 1a. Fluid pipes 12 and 13 are each connected at one end to one of the ends of the fluid passage 11. The other end of the fluid pipe 12 is connected to an air supply source or water supply source, and the other end of the fluid pipe 13 is opened into the atmosphere;. In addition, air pipes 15 (two air pipes 15 in this embodiment) which blow air 14 onto the lower clamper 4 are installed beneath the lower clamper 4.

In operation, fluid (such as air or water) is constantly or periodically supplied to the fluid pipe 12, so that the fluid flows through the fluid passage 11 formed in the upper clamper 3. In addition, air 14 is constantly or periodically blown onto the lower clamper 4 from the air pipes 15.

Thus, the heating of the upper clamper 3 and lower clamper 4 by radiant heat from the pellet stage 7 and the bonding tool 8 is prevented by the air and water.

In the structure above, since the upper clamper 3 and lower clamper 4 are both cooled, these clampers 3 and 4 do not cause any thermal expansion of the leads 1 of the tab tape 2. In other words, no change occurs in the alignment of the leads 1 and bumps 5 between the time at which the lower clamper 4 is moved upward to press the tab tape 2 against the upper clamper 3 and the camera (not shown) detects any positional discrepancy of the leads 1 and the time at which the bonding tool 8 is subsequently lowered so as to perform the bonding. Accordingly, high-precision bonding is accomplished.

Figure 2A:
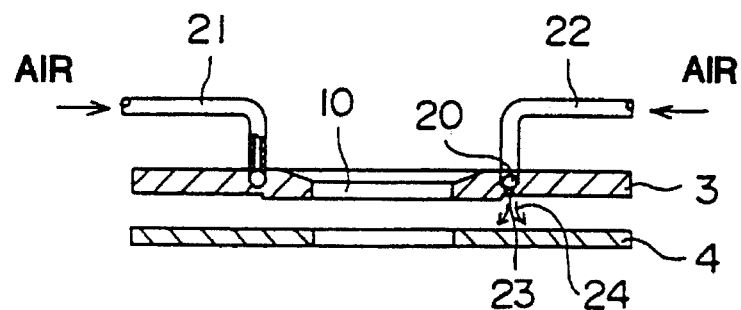
FIG. 2a is a sectional view of the essential area thereof taken along the line 2a—2a in FIG. 2b.
Figure 2B:
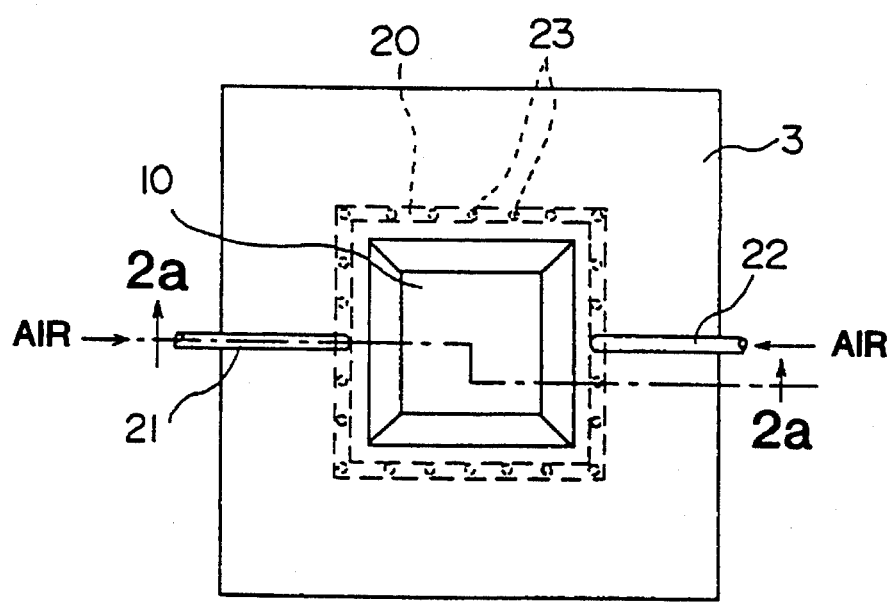
FIG. 2b is a top view of the upper clamper.
Figure 6:
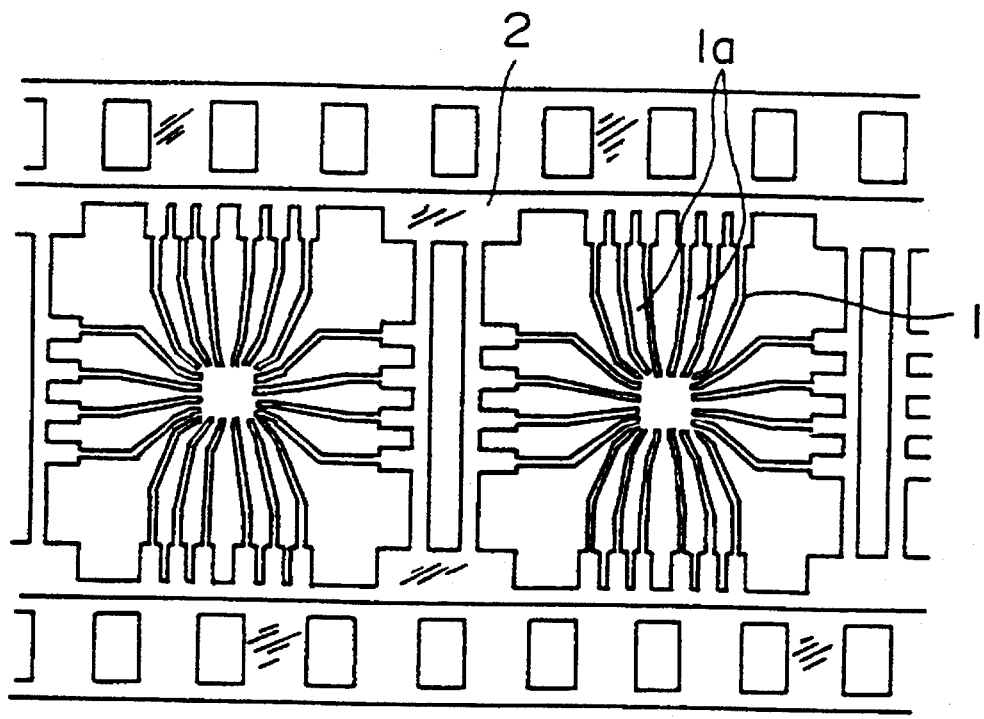
FIG. 6 is a top view of a tab tape.

FIG. 2 illustrates a second embodiment of the present invention. In this embodiment, an air passage 20 is provided in the upper clamper 3 so that the air passage 20 surrounds the bonding window 10. Fluid pipes 21 and 22 which supply air into the air passage 20 are connected at one end of each of them to the upper surface of the upper clamper 3 and at another end thereof to air an source (not shown). In addition, a plurality of air blowing holes 23 which communicate with the air passage 20 are spacedly formed in the undersurface of the upper clamper 3. These air blowing holes 23 are provided so as to positionally correspond to spaces formed in the tab tape 2 such as gaps 1a which are located between the leads 1 as shown in FIG. 6.

Accordingly, the upper clamper 3 is cooled by air which is supplied from the fluid pipes 21 and 22 and flows through the air passage 20; on the other hand, the lower clamper 4 is cooled by air 24 which is blown out downward from the air blowing holes 23 of the air passage 20. Thus, an effect similar to that in the first embodiment is obtained.

In this second embodiment, not only the lower clamper 4 but also the tab tape 2 is cooled by the air 24 which is blown out of the air blowing holes 23. Thermal expansion of the leads 1 is thus prevented even more effectively.

Figure 3A:
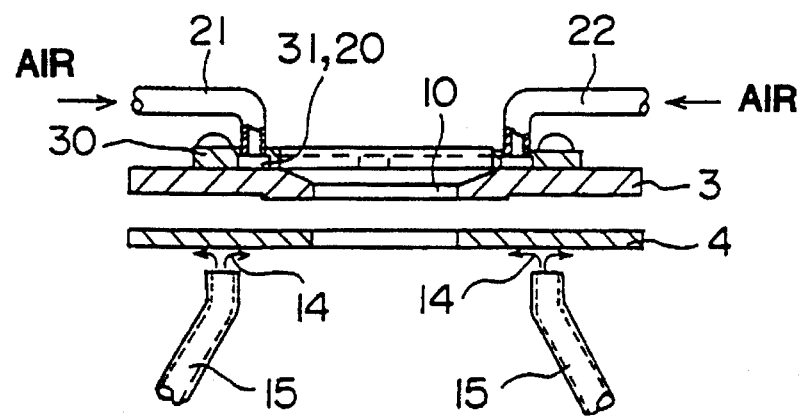
FIG. 3a is a sectional view of the essential area thereof.
Figure 3B:
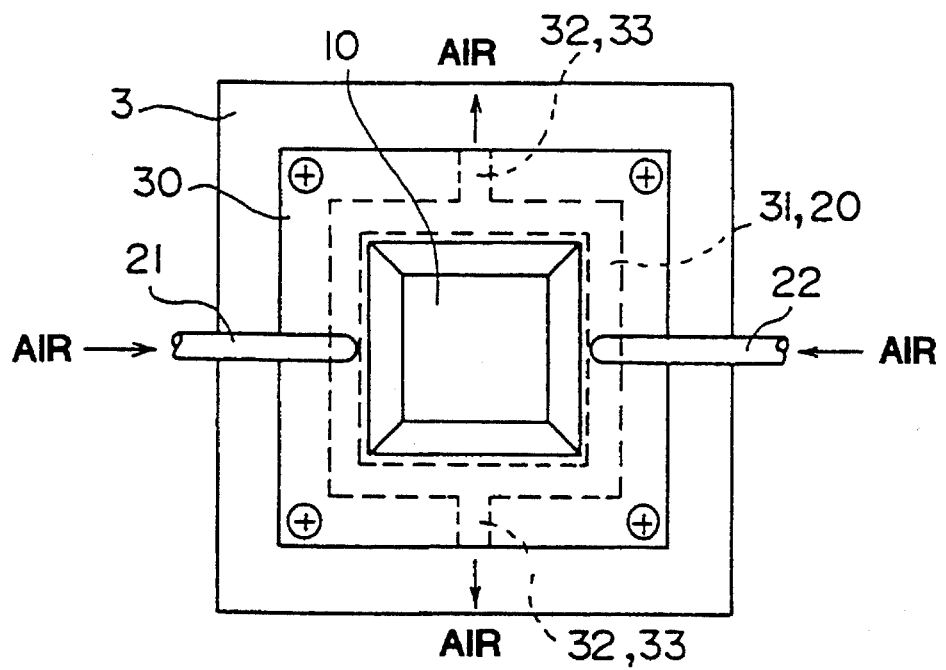
FIG. 3b is a top view of the upper clamper.

FIG. 3 illustrates a third embodiment of the present invention. In the first and second embodiments described above, the fluid passage 11 and the air passage 20 are respectively provided inside the upper clamper 3.

In this third embodiment, however, a guide cover 30 is used so as to be mounted to the upper clamper 3. The guide cover 30 is provided with a rectangular recessed groove 31 in its undersurface so as to surround the bonding window 10 of the upper clamper 3 and with two straight recessed grooves 32 which extend outwardly from the rectangular recessed groove 31. Accordingly, an air passage 20 is formed by the rectangular recessed groove 31 of the guide cover 30 and the upper surface of the upper clamper 3, and air exhaust passages 33 are formed by the straight recessed grooves 32 of the guide cover 30 and the upper surface of the upper clamper 3. In addition, air pipes 21 and 22 which supply air to the air passage 20 form an air source are connected to the guide cover 30 so as to open into the recessed groove 31. As in the embodiment shown in FIG. 1, air pipes 15 are provided underneath the lower clamper 4 so that air blowing out of the air pipes 15 cools the lower clamper 4. An effect similar to that obtained in the first embodiment can be obtained using this construction as well.

The recessed grooves 31 and 32 can be formed in the upper surface of the upper clamper 3 and not in the guide cover 30; furthermore, these grooves 31 and 32 can be formed in both the undersurface of the guide, cover 30 and the upper surface of the upper clamper 3. In other words, the air passage 20 and the air exhaust passage 33 can be formed by the recessed grooves which are formed in both the guide cover 30 and the upper clamper 3 or in either one of these parts.

Figure 4A:
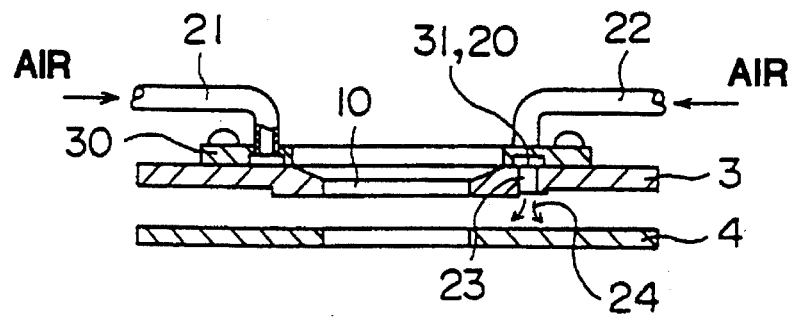
FIG. 4a is a sectional view of the essential area thereof taken along the line 4a—4a in FIG. 4b.
Figure 4B:
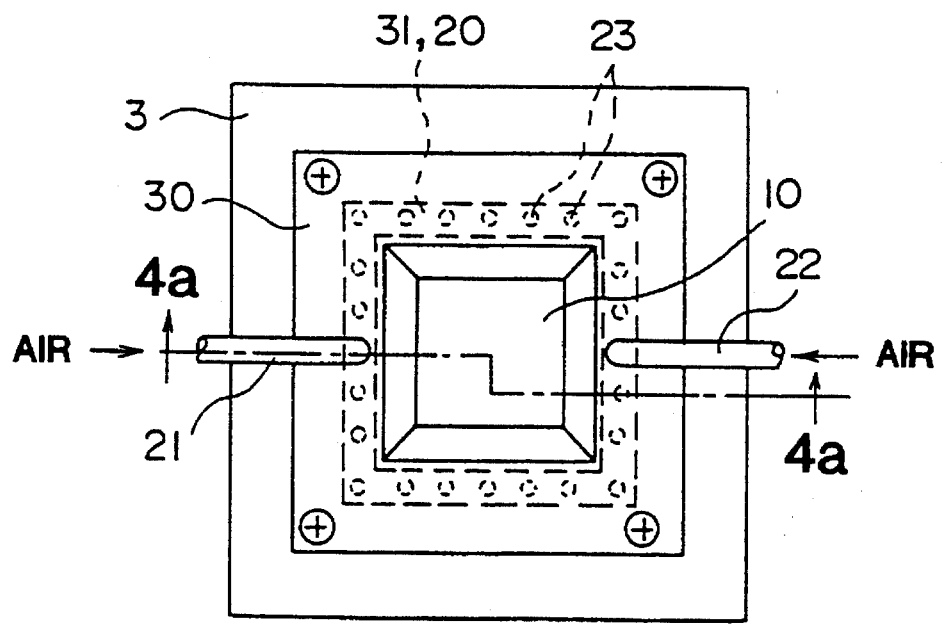
FIG. 4b is a top view of the upper clamper.

FIG. 4 illustrates a fourth embodiment of the present invention. This embodiment is a combination of the concepts of the second embodiment and the third embodiment. However, the straight recessed grooves 32 are not used in this third embodiment; and instead, air blowing holes 23 are spacedly formed in the upper clamper 3 so that the air blowing holes 23 communicate with the air passage 20 which is formed by the recessed groove 31 of the guide cover 30.

In this embodiment, the air supplied through the air supply pipes 21 and 22 which are connected to the air passage 20 cools the upper clamper 3 and blown out of the air blowing holes 23, thus cooling the lower clamper 4.

An effect similar to that obtained in the second embodiment can be obtained by the structure of this third embodiment.

In FIGS. 2 through 4 which show the second through fourth embodiments, the tab tape 2, the semiconductor pellet 6 and the pellet stage 7 are not shown therein; however, it goes without saying that these parts are installed as in FIG. 1 which is for the first embodiment.

Moreover, in cases where the lower clamper 4 is not sufficiently cooled by the air 24 which is blown out through the upper clamper 3 in the second and fourth embodiments, air pipes 15 as used in other embodiments can be provided underneath the lower clamper 4 so as to cool the lower clamper 4 to a desired temperature.

In the embodiments described above, a description is made for a case where bumps 5 on semiconductor pellets 6 are bonded to the leads 1 of the tab tape 2; however, the structure of the present invention is applicable in cases where a bump itself is bonded to a lead of the tab tape 2.

In addition, all of the embodiments described above refer to so-called "gang bonding", in which all of the leads 1 on the tab tape 2 are bonded to bumps 5 at one time. However, the present invention can be used in the case of so-called "single bonding", in which corresponding leads 1 and bumps 5 are individually bonded.

As described in detail in the above, according to the present invention, since the cooling means which cool the upper and lower clampers are provided, the clampers do not provide any thermal affect to the leads, and therefore thermal expansion of the leads can be minimized, and high-precision bonding can be performed.

I claim:

1. A tape bonding apparatus comprising a tape clamping mechanism which clamps a tab tape with an upper clamper and a lower clamper, a stage which is provided under said tape clamping mechanism so as to carry thereon semiconductor pellets that are bonded to leads of said tab tape, and a bonding tool which is provided above said clamper mechanism so as to be move up and down, said tape bonding apparatus further comprising a cooling means for cooling said upper clamper and lower clamper.

2. A tape bonding apparatus according to claim 1, wherein:

said cooling means for cooling said upper clamper comprises a fluid passage and a fluid supply means which is connected to said fluid passage, said fluid passage being provided inside said upper clamper so as to surround a bonding window formed in said upper clamper, and said fluid supply means supplying a fluid to said fluid passage, and said cooling means for cooling said lower clamper comprises air blowing means which blow air onto said lower clamper.

3. A tape bonding apparatus according to claim 1, wherein:

said cooling means for cooling said upper clamper comprises an air passage and an air supply means, said air passage being provided inside said upper clamper so as to surround a bonding window formed in said upper clamper, and said air supply means supplying air to said air passage, and said cooling means for cooling said lower clamper comprises air blowing holes which are formed in an undersurface of said upper clamper so as to communicate with said air passage.

4. A tape bonding apparatus according to claim 1, wherein:

said cooling means for cooling said upper clamper comprises a guide cover and an air supply means, said guide cover being mounted on an upper surface of said upper clamper so as to form an air passage between said guide cover and said upper clamper which surrounds a window formed in said upper clamper, said air passage being formed by a recessed groove formed at least in an under surface of said guide cover or in an upper surface of said upper clamper, and said cooling means for cooling said lower clamper comprises air blowing means which blow out air onto said lower clamper.

5. A tape bonding apparatus according to claim 1, wherein:

said cooling means for cooling said upper clamper comprises a guide cover and an air supply means, said guide cover being mounted on an upper surface of said upper clamper so as to form an air passage between said guide cover and said upper clamper which surrounds a window formed in said upper clamper, said air passage being formed by a recessed groove formed at least in an under surface of said guide cover or in an upper surface of said upper clamper, and said cooling means for cooling said lower clamper comprises air blowing holes which are formed in an undersurface of said upper clamper so as to communicate with said air passage.

6. A cooling system used in a tape bonding apparatus which comprises a tab tape clamping mechanism for clamping a tab tape between an upper clamper and a lower clamper when said lower clamper is moved upward, a pellet stage provided under said tape clamping mechanism so as to carry thereon a pellet which has bumps to be bonded to leads of said tab tape, and a bonding tool which is provided above said clamper mechanism in a vertically movable fashion, said cooling system comprising a fluid passage provided in said upper clamper and a fluid blow out means provided outside of said lower clamper, thus cooling said upper clamper by a fluid flowing in said fluid passage and cooling said lower clamper with fluid blown out of said fluid blow out means.

7. A cooling system according to claim 6, wherein said fluid blow out means is provided in said upper clamper so as to blow fluid onto said lower clamper.

8. A cooling system according to claim 6, wherein said fluid blow out means is provided under said lower clamper so as to blow fluid to said lower clamper.

* * * * *

UNITED STATES PATENT AND TRADEMARK OFFICE
CERTIFICATE OF CORRECTION

PATENT NO. : 5,622,304
DATED : April 22, 1997
INVENTOR(S) : Koji Sato

It is certified that error appears in the above-indentified patent and that said Letters Patent is hereby corrected as shown below:

Title page,
Item [75] Inventor: Change "Koji Sato, Akishimi, Japan" to
--Koji Sato, Akishima, Japan--

Signed and Sealed this

Twenty-ninth Day of July, 1997

Attest:

BRUCE LEHMAN

*Attesting Officer*  *Commissioner of Patents and Trademarks*